United States Patent  (10) Patent No.: US 7,672,101 B2
Lin et al.  (45) Date of Patent: Mar. 2, 2010

(54) ESD PROTECTION CIRCUIT AND METHOD

(75) Inventors: Shu-Huei Lin, Hsinchu (TW);
Chong-Gim Gan, Yuanlin Township, Changhuu County (TW); Yi-Hsun Wu, Hsin-Chu (TW); Yu-Chang Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/852,799

(22) Filed: Sep. 10, 2007

(65) Prior Publication Data

US 2009/0067105 A1 Mar. 12, 2009

(51) Int. Cl.
H02H 9/00 (2006.01)
(52) U.S. Cl. .................... 361/56; 361/91.1; 361/111
(58) Field of Classification Search ............ 361/56, 361/91.1, 111
See application file for complete search history.

(56) References Cited

U.S. PATENT DOCUMENTS

| | | | |
|---|---|---|---|
| 4,607,270 A | 8/1986 | Iesaka | |
| 5,583,381 A | 12/1996 | Hara et al. | |
| 5,615,073 A * | 3/1997 | Fried et al. | 361/56 |
| 5,646,434 A * | 7/1997 | Chrysostomides et al. | 257/355 |
| 5,707,886 A * | 1/1998 | Consiglio et al. | 438/200 |
| 6,284,616 B1 | 9/2001 | Smith | |
| 6,396,306 B2 | 5/2002 | Dring et al. | |
| 6,600,356 B1 * | 7/2003 | Weiss | 327/310 |
| 6,768,616 B2 * | 7/2004 | Mergens et al. | 361/56 |
| 7,271,629 B2 * | 9/2007 | Jeon et al. | 327/112 |
| 2002/0084490 A1 | 7/2002 | Ker et al. | |
| 2002/0154463 A1 | 10/2002 | Mergens et al. | |

(Continued)

FOREIGN PATENT DOCUMENTS

CN 1256516 6/2000

(Continued)

OTHER PUBLICATIONS

"Bipolar junction transistor" at http://en.wikipedia.org/wiki/Bipolar_transistor on May 2, 2007.

(Continued)

*Primary Examiner*—Stephen W Jackson
*Assistant Examiner*—Terrence R Willoughby
(74) *Attorney, Agent, or Firm*—Duane Morris LLP

(57) ABSTRACT

A system includes a driving device operating at first supply voltage $V_{dd1}$ and having a CMOS output. A driven devise operates at a second supply voltage $V_{dd2}$ lower than the first supply voltage $V_{dd1}$, and has a CMOS input with an NMOS pull-down transistor. A protection circuit includes a first resistor coupled to the CMOS output of the driving device and a gate of the NMOS pull-down transistor. A parasitic NPN bipolar junction transistor has a drain connected to the gate of the NMOS pull-down transistor sad a source coupled to a lower-voltage supply rail $V_{SS}$. A second resistor connects a gate of the parasitic NPN bipolar junction transistor to $V_{SS}$. The second resistor has a resistance sized for controlling a trigger voltage of the parasitic NPN bipolar junction transistor for protecting a gate oxide layer of the NMOS pull-down transistor from an electrostatic discharge.

17 Claims, 4 Drawing Sheets

U.S. PATENT DOCUMENTS

| | | | |
|---|---|---|---|
| 2004/0179314 | A1 | 9/2004 | Chen |
| 2004/0245592 | A1 | 12/2004 | Harmon et al. |
| 2005/0045952 | A1* | 3/2005 | Chatty et al. ............... 257/355 |
| 2005/0202661 | A1 | 9/2005 | Ceruzzi et al. |
| 2006/0065933 | A1 | 3/2006 | Chu et al. |
| 2006/0092592 | A1 | 5/2006 | Huang |
| 2006/0192251 | A1 | 8/2006 | Yu et al. |
| 2007/0007626 | A1* | 1/2007 | Ma et al. ................... 257/591 |

FOREIGN PATENT DOCUMENTS

| | | |
|---|---|---|
| JP | 09-064057 | 7/1997 |

OTHER PUBLICATIONS

"Avalanche transistor" at http://en.wikipedia.org/wiki/Avalanche_transistor on May 22, 2007.

"Breakdown voltage" at http://en.wikipedia.org/wiki/Breakdown_voltage on May 22, 2007.

"GgNMOS" at http://en.wikipedia.org/wiki/Ggnmos on May 23, 2007.

"Silicon-controlled rectifier" at http://en.wikipedia.org/wiki/Silicon_controlled_rectifier on May 24, 2007.

Office Action from China Patent Office dated Oct. 30, 2009 issued in connection with corresponding Chinese Patent Application.

* cited by examiner

ESD PROTECTION CIRCUIT AND METHOD

FIELD OF THE INVENTION

The present disclosure relates generally to integrated circuit designs, and more particularly to as interface between circuits operating at different power supply voltages.

BACKGROUND

With advances in electronic products, semiconductor technology has been applied widely manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and integrated circuits including various ("mixed") supply voltages ($V_{dd}$) have been proposed.

FIG. 1 shows an example of a system having a driving device 110 operating at first supply voltage ($V_{dd}$=1.8 Volts), and having an output, and a driven device 150 operating at a second supply Voltage ($V_{dd}$=1.2 Volts) lower than the first supply voltage. For example, devices 110 and 150 may be phased look loops (PLL), ring oscillators, logic blocks, and/or other circuits, and/or combinations thereof. Both devices have a common lower-voltage power supply rail $V_{ss}$. The driving device 110 has a CMOS output buffer, including a PMOS pull-up transistor 112 and an NMOS pull-down transistor 114. The driven device 150 has a CMOS input buffer, including a PMOS pull-up transistor 152 and an NMOS pull-down transistor 154.

The-output 116 of driving device 110 is provided as a control signal to the gates of the CMOS input buffer of the driven device 150. However, the gate oxide of a metal-oxide-semiconductor (MOS) transistor of an integrated circuit is most susceptible to damage.

When an ESD event occurs, an ESD voltage is conducted by the higher-voltage power supply rail Vdd of the driving device to the PMOS transistor 112 of the CMOS output buffer. The drain of the PMOS transistor 112 is connected to the output terminal 116 of driving device 110, which is connected by an interface to the input 156 of driven device 150. CMOS input 156 is connected to the gate of the NMOS pull-down transistor 154 of the CMOS input buffer. The gate oxide of NMOS 154 may be destroyed by being contacted with a voltage only a few volts higher than the supply voltage. Electrostatic voltages from common environmental sources can easily reach thousands, or even tens of thousands of volts.

Such voltages are destructive even though the charge and any resulting current are extremely small.

SUMMARY OF THE INVENTION

In some embodiments, a system has a driving device with a first supply voltage $V_{dd1}$ and an output, and a driven device having a second simply voltage $V_{dd2}$ lower than the first supply voltage $V_{dd1}$. The driven device has an input coupled to the output of the driving device. A protection circuit comprises a first resistor coupled to the output of the driving device and a gate of an input NMOS transistor of the driven device. A parasitic NPN bipolar junction transistor has a drain connected to the gate of the input NMOS transistor of the driven device and a source coupled to a lower-voltage supply rail $V_{ss}$. A second resistor connects a gate of the parasitic NPN bipolar junction transistor to $V_{ss}$. The second resistor has a resistance sized for controlling a trigger voltage of the parasitic NPN bipolar junction transistor for protecting a gate oxide layer of the input NMOS transistor of the driven device from an electrostatic discharge.

In some embodiments, a system comprises a driving device operating at first supply voltage $V_{dd1}$ and having a CMOS output. A driven device operates at a second supply voltage $V_{dd2}$ lower than the first supply voltage $V_{dd1}$, and has a CMOS input with, an NMOS pull-down transistor. A protection circuit includes a first resistor coupled to the CMOS output of the driving device and a gate of the NMOS pull-down transistor. A parasitic NPN bipolar junction transistor has a drain connected to the gate of the NMOS poll-down transistor and a source coupled to a lower-voltage supply rail $V_{ss}$. A second resistor connects a gate of the parasitic NPN bipolar junction transistor to $V_{ss}$. The second resistor has a resistance steed for controlling a trigger voltage of the parasitic NPN bipolar junction transistor for protecting a gate oxide layer of the NMOS pull-down transistor from an electrostatic discharge.

In some embodiments, a protection, method is provided in a system having a driving device with a first supply voltage $V_{dd1}$ and an output, and a driven device having a second supply voltage $V_{dd2}$ lower than the first supply voltage $V_{dd1}$, wherein the driven device has an input coupled to the output of fee driving device. The method includes: coupling the output of the driving device and a gate of an input NMOS transistor of the driven device with a first resistor; connecting a drain of parasitic NPN bipolar function transistor (BJT) to the gate of the input NMOS transistor of the driven device; coupling a source of the parasitic NPN BJT to a lower-voltage supply rail $V_{ss}$; connecting a gate of the parasitic NPN BJT to $V_{ss}$ with a second resistor; and triggering the parasitic NPN BJT by avalanche breakdown, thereby protecting a gate oxide of the input NMOS transistor of the driven device from an electrostatic discharge.

BRIEF DESCRIPTION OP THE DRAWINGS

DETAILED DESCRIPTION

This description of the exemplary embodiments is intended to be read in connection with the accompanying drawings, which are to he considered part of the entire written description. Terms concerning coupling and the like, such as "connected" and "interconnected," refer to a relationship wherein structures are in electrical communication with one another, either directly or indirectly through intervening structures, unless expressly described otherwise.

Figure 1:
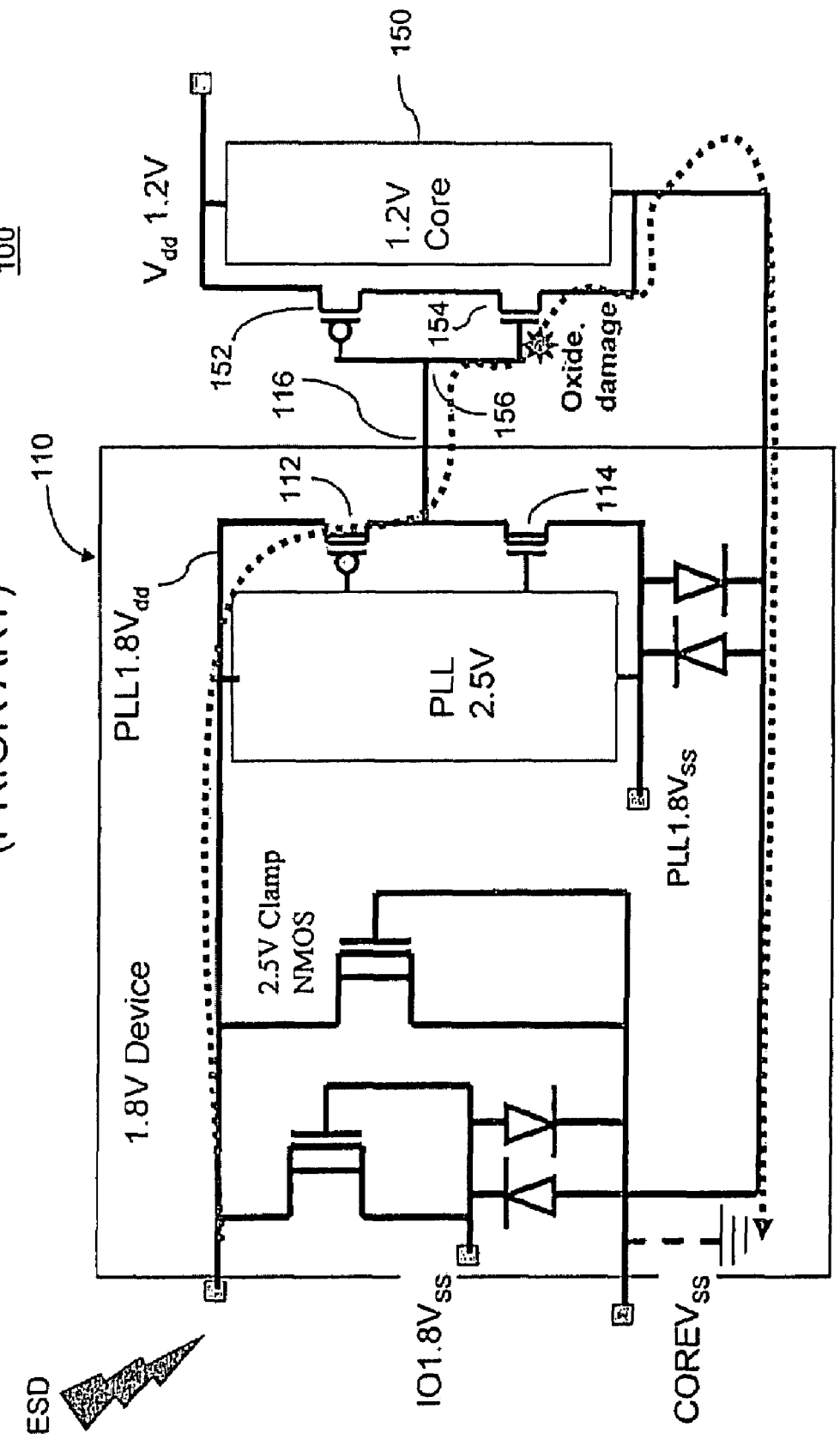
FIG. 1 is a schematic diagram of a conventional circuit system.
Figure 2:
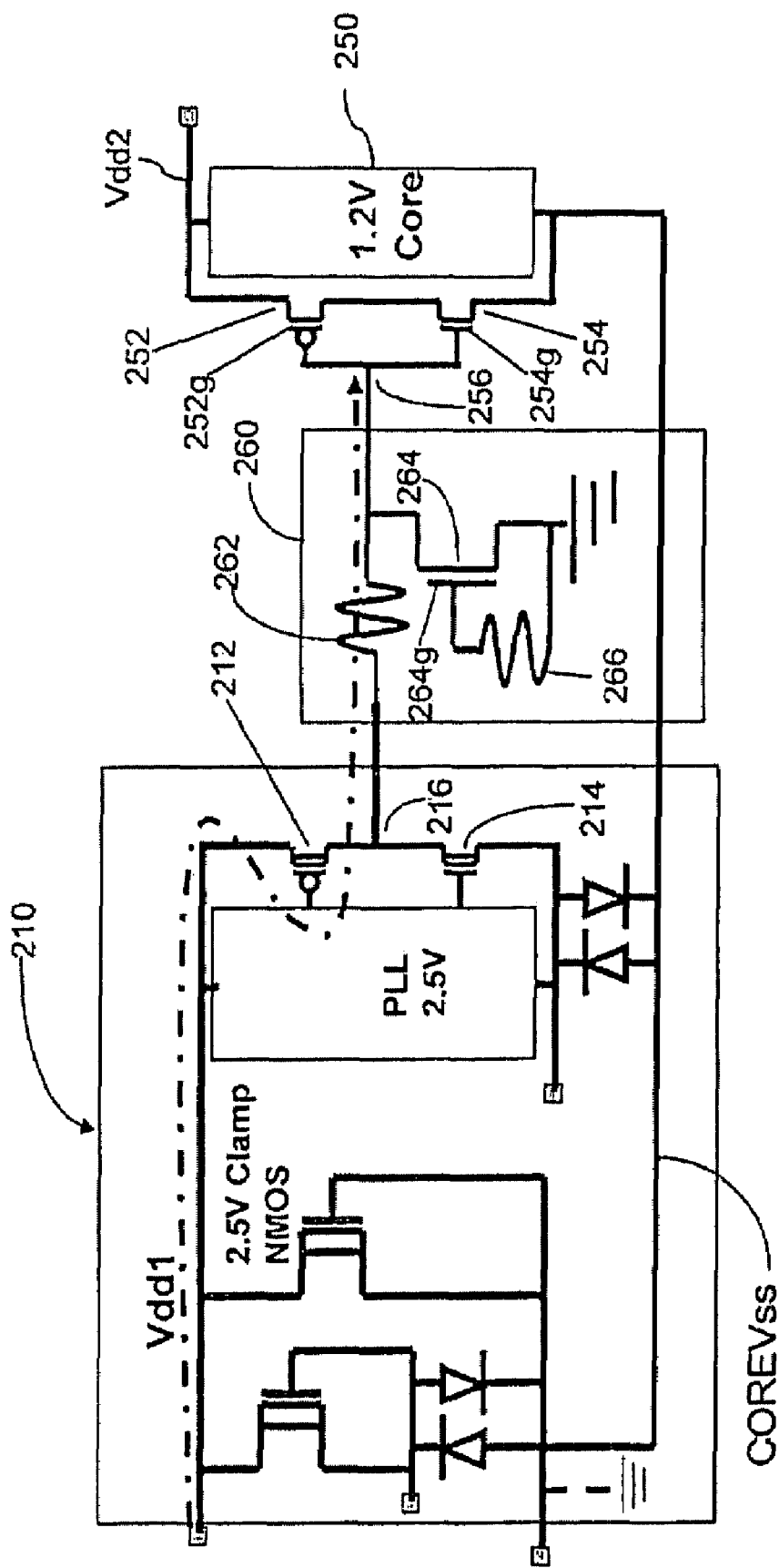
FIG. 2 is a schematic diagram of an exemplary circuit system including an ESD protection circuit.

FIG. 2 shows an example of a system having a driving device 210 with a first supply voltage $V_{dd1}$ and an output 216, and a driven device 250 having a second supply voltage $V_{dd2}$ lower than the first supply voltage $V_{dd1}$. In the example of FIG. 2, the driving device 210 operates at first supply voltage (e.g., $V_{dd1}$=1.8 Volts), and the driven device 250 operating at a Second supply voltage (e.g., $V_{dd2}$=1.2 Volts) lower than the first supply voltage. For example, devices 210 and 250 may be phased lock loops (PLL) ring oscillators, logic blocks, and/or other circuits and/or combinations thereof. Both devices have a common lower-voltage power supply rail $V_{ss}$. Although the exemplary supply voltages are 1.8 and 1.2 volts, the driving device and the driven device may have any combination of voltages.

The driving device 210 has a CMOS output buffer, including a PMOS pull-up transistor 212 and an NMOS pull-down transistor 214. The driven device 250 has a CMOS input buffer, including a PMOS pull-up transistor 252 and an NMOS pull-down transistor 254.

The output 216 of driving device 210 is provided as a control signal to the gates of the CMOS input buffer of the driven device 250.

The driven device 250 has an input 258 coupled to the output 216 of the driving device 210.

An ESD protection circuit 260 is provided between the driving device 210 and the driven device 250. One characteristic of the ESD protection device is that it should minimize interference with the operation of the devices it is designed to protect, while at the same time providing good protection when abnormal or ESD voltage incidents occur. During normal operation, the protection circuit should provide a minimal voltage drop between the CMOS output of the driving circuit 210 and the CMOS input 256 of the driven circuit 250, to maintain high performance.

In some embodiments, an ESD protection device 260 has an N channel metal oxide semiconductor (NMOS) 264 with an associated lateral parasitic NPN bipolar transistor. Once triggered by an ESD event, the device 264 operates in the lateral NPN mode to pass the high current. A vertical bipolar NPN structure has superior power dissipation capability.

The ESD protection circuit includes a first resistor 262 coupled to the output 216 of the driving device 210 and to the gate 254g of an input NMOS transistor 254 of the driven device 250.

The parasitic NPN bipolar junction transistor 264 has a dram connected to the gate 254g of the input NMOS transistor 254 of the driven device 250 and a source coupled to a lower-voltage supply rail $V_{ss}$. For example, the drain may be directly connected to the resistor 262 and to the CMOS input 256 of the driven device 250. Preferably, the transistor 264 is of the same type and technology as the protected transistor 254. For example, the transistors 254 and 264 may both be NMOS transistors fabricated using 130 nanometer technology.

A second resistor 266 connects the gate 264g of the parasitic NPN bipolar junction transistor 264 to $V_{ss}$.

Figure 4:
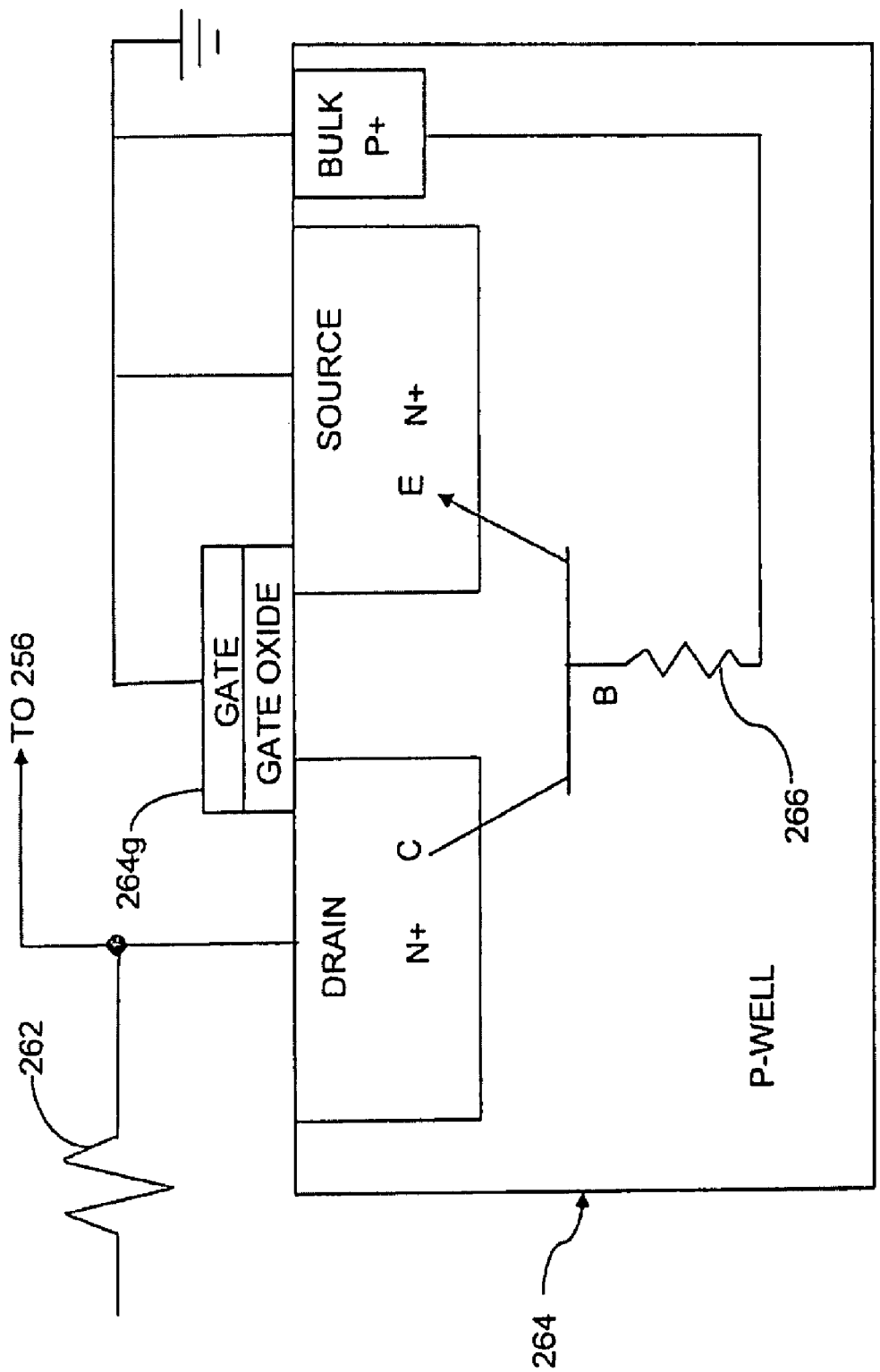
FIG. 4 is a cross sectional diagram of the grounded gate NMOS transistor of FIGS. 2 and 3.

As shown in FIG. 4, the exemplary ESD protection circuit 260 uses a grounded gate NMOS (ggNMOS) 264. As the name implies, a ggNMOS device includes a relatively large (width/length) NMOS device in which the gate 264g, source, and base (B) are tied together to ground. The dram of the ggNMOS is connected to the CMOS input 256 of the driven device, and in particular, to the gate of the input NMOS 254 being protected. A parasitic NPN bipolar junction transistor (BJT) is thus formed with the drain (n-type) acting as the collector (C), the source (n-type) as the emitter (E), and the substrate (p-type) as the base (B). The parasitic resistance present between the emitter and base terminals of the parasitic NPN BJT 264 is a result of the finite conductivity of the p-type doped substrate.

During normal operation, as shown in FIG. 2, the higher power supply voltage $V_{dd1}$ of the driving circuit passes through the pull-up transistor 212 of the driving circuit 210, and is applied to the gate 252g of PMOS pull-up input transistor 252 and fee gate 254g of NMOS pull-down transistor 254. The relatively small resistance of resistor 262 (e.g., about 5 ohms) dissipates very little power, and does not reduce the performance of the driven circuit 250. Since the gate 264g of the parasitic NPN BJT 254 is coupled to ground, the NPN BJT 264 normally does not pass current, and essentially acts as an open circuit.

Figure 3:
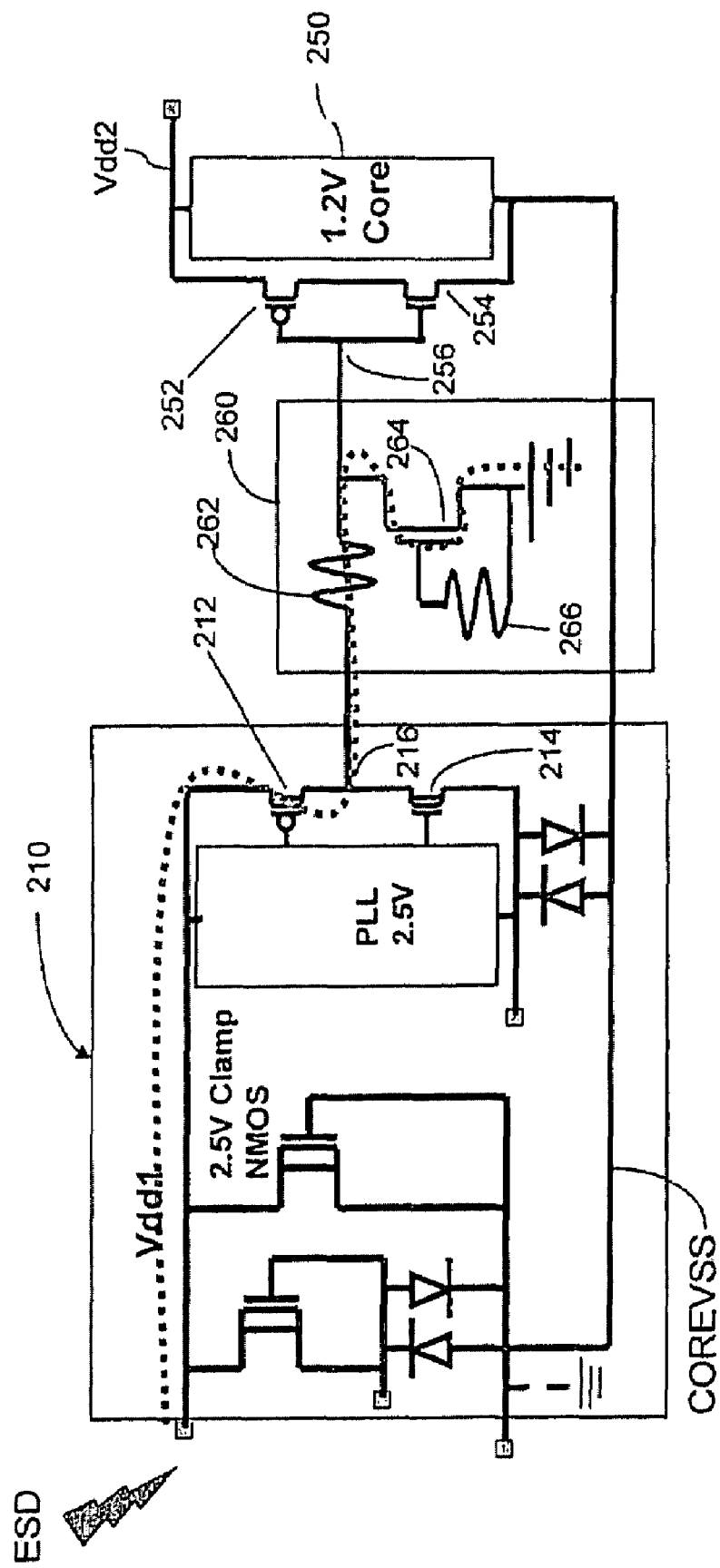
FIG. 3 shows the circuit system of FIG. 2, during an ESD event.

As shown in FIG. 3, when an ESD event occurs, an ESD voltage is conducted by the higher-voltage power supply rail $V_{dd1}$ of the driving device 210 through the first resistor 262 to the drain of the NPN BJT 264.

The exemplary NPN BJT 264 is an avalanche transistor. An avalanche transistor is a BJT designed for operation in the region of its collector-current/collector-to-emitter voltage characteristics beyond the collector to emitter breakdown voltage, called avalanche breakdown region. Operation in the avalanche breakdown region is called avalanche mode operation; it gives avalanche transistors the ability to switch very high currents with less than a nanosecond trigger time. Avalanche mode switching uses avalanche multiplication of current flowing through the collector-base junction as a result of impact ionisation of the atoms in the semiconductor crystal lattice. Avalanche breakdown in semiconductors can provide very high switching speeds, due to avalanche multiplication.

When a positive ESD event appears upon the output 216 of the driving circuit 210, the collector-emitter junction, of the parasitic NPN becomes forward biased to the point of avalanche breakdown. At this point the positive current flowing from the parasitic emitter to ground induces a voltage potential across the parasitic substrate resistor 266, causing a positive voltage to appear across the base-emitter junction. The positive $V_{BE}$ forward biases this junction, triggering the turning on of the parasitic NPN transistor 264 in avalanche mode.

NPN BJT 264 immediately switches to avalanche mode and begins to transmit current from its drain to its source, which is connected to the lower power supply rail $V_{ss}$. Thus, the high current of the ESD is diverted away from the gate 254g of the input NMOS transistor 254 of the driven device 250. Meanwhile, the resistor 266 controls the speed of triggering the transistor 264 in avalanche mode by reducing the collector-to-emitter trigger voltage for NMOS 264 in avalanche mode. For speeding up the triggering of the avalanche mode, a relatively large resistance 266 is desirable.

For example, in one embodiment using 130 nanometer technology, resistor 266 has a resistance of about 1000 ohms, while resistor 262 has a resistance of about 5 ohms. A resistor 266 of about 1000 ohms reduces the avalanche mode triggering voltage from about 5 Volts to about 4.5 Volts. One of ordinary skill in the art can readily select other suitable resistances without undue experimentation. For example to tune the trigger time, a resistance 266 from about 1000 ohms to about 10,000 ohms may be used.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. In a system having a driving device with a first supply voltage Vdd1 and an output, and a driven device having a second supply voltage Vdd2 lower than the first supply voltage Vdd1, wherein the driven device has an input coupled to the output of the driving device, a protection circuit comprising:
   a first resistor coupled to the output of the driving device and a gate of an input NMOS transistor of the driven device;

a gate grounded NMOS (GGNMOS) having a drain coupled between the first resistor and the input of the driven device, the GGNMOS having a source coupled to ground;

a parasitic NPN bipolar junction transistor having a collector connected to the gate of the input NMOS transistor of the driven device and an emitter coupled to a lower-voltage supply rail Vss, the source of the GGNMOS forming the emitter of the parasitic NPN bipolar junction transistor, the drain of the GGNMOS forming the collector of the parasitic NPN bipolar junction transistor; and a second resistor connecting a base of the parasitic NPN bipolar junction transistor to Vss, the second resistor having a resistance sized for controlling a trigger voltage of the parasitic NPN bipolar junction transistor for protecting a gate oxide layer of the input NMOS transistor of the driven device from an electrostatic discharge.

2. The protection circuit of claim 1, wherein the parasitic NPN bipolar junction transistor is an avalanche transistor.

3. The protection circuit of claim 1, wherein the output of the driving device is connected to a drain of a PMOS pull-up transistor, and the PMOS pull-up transistor has a source connected to Vdd1.

4. The protection circuit of claim 1, wherein the parasitic NPN bipolar junction transistor is of the same type as the input NMOS transistor of the driven device.

5. The protection circuit of claim 1, wherein the second resistor has a resistance sized to reduce a trigger voltage of the parasitic NPN bipolar junction transistor by about 0.5 Volt below a nominal trigger voltage of the parasitic NPN bipolar junction transistor relative to Vss.

6. The protection circuit of claim 1, wherein the second resistor has a resistance larger than a resistance of the first resistor.

7. The protection circuit of claim 6, wherein the resistance of the first resistor is about 5 ohms, and the resistance of the second resistor is about 1000 ohms.

8. The protection circuit of claim 1, wherein the input NMOS transistor of the driven device has a source connected to a lower-voltage supply rail of the driven device.

9. The protection circuit of claim 8, wherein:
the driven device has a CMOS input, and the input NMOS transistor of the driven device is a pull-down transistor of the CMOS input;
the pull-down transistor has a drain connected to a drain of a PMOS pull-up transistor of the CMOS input; and
the PMOS pull-up transistor of CMOS input has:
a gate connected to the first resistor and the gate of the pull-down transistor, and
a source connected to Vdd2.

10. A system comprising:
a driving device operating at first supply voltage Vdd1 and having a CMOS output;
a driven device operating at a second supply voltage Vdd2 lower than the first supply voltage Vdd1, and having a CMOS input with an NMOS pull-down transistor; and
a protection circuit comprising:
a first resistor coupled to the CMOS output of the driving device and a gate of the NMOS pull-down transistor;
a gate grounded NMOS (GGNMOS) having a drain coupled between the first resistor and the CMOS input of the driven device, the GGNMOS having a source coupled to ground;

a parasitic NPN bipolar junction transistor having a collector connected to the gate of the NMOS pull-down transistor and a emitter coupled to a lower-voltage supply rail Vss, the source of the GGNMOS forming the emitter of the parasitic NPN bipolar junction transistor, the drain of the GGNMOS forming the collector of the parasitic NPN bipolar junction transistor; and a second resistor connecting a gate of the parasitic NPN bipolar junction transistor to Vss, the second resistor having a resistance sized for controlling a trigger voltage of the parasitic NPN bipolar junction transistor for protecting a gate oxide layer of the NMOS pull-down transistor from an electrostatic discharge.

11. The system of claim 10, wherein the parasitic NPN bipolar junction transistor is an avalanche transistor.

12. The system of claim 10, wherein the parasitic NPN bipolar junction transistor is of the same type as the NMOS pull-down transistor.

13. The system of claim 10, wherein the second resistor has a resistance sized to reduce a trigger voltage of the parasitic NPN bipolar junction transistor by about 0.5 Volt below a nominal trigger voltage of the parasitic NPN bipolar junction transistor relative to Vss.

14. The system of claim 10, wherein the second resistor has a resistance larger than a resistance of the first resistor.

15. In a system having a driving device with a first supply voltage Vdd1 and an output, and a driven device having a second supply voltage Vdd2 lower than the first supply voltage Vdd1, wherein the driven device has an input coupled to the output of the driving device, a method comprising the steps of:
coupling the output of the driving device and a gate of an input NMOS transistor of the driven device with a first resistor;
coupling a drain of a gate grounded NMOS (GGNMOS) between the first resistor and the input of the driven device, the GGNMOS having a source coupled to ground;
connecting a collector of a parasitic NPN bipolar junction transistor (BJT) to the gate of the input NMOS transistor of the driven device;
coupling an emitter of the parasitic NPN BJT to a lower-voltage supply rail Vss, the source of the GGNMOS forming the emitter of the parasitic NPN bipolar junction transistor, the drain of the GGNMOS forming the collector of the parasitic NPN bipolar junction transistor;
connecting a base of the parasitic NPN BJT to Vss with a second resistor; and
triggering the parasitic NPN BJT by avalanche breakdown, thereby protecting a gate oxide of the input NMOS transistor of the driven device from an electrostatic discharge.

16. The method of claim 15, wherein the triggering step includes triggering the parasitic NPN BJT by avalanche breakdown at a lower voltage than a trigger voltage that would be used if the second resistor were not provided.

17. The method of claim 16, wherein the triggering step includes triggering the parasitic NPN BJT by avalanche breakdown at a voltage that is about 0.5 Volts lower than a trigger voltage that would be used if the second resistor were not provided.

* * * * *

UNITED STATES PATENT AND TRADEMARK OFFICE
CERTIFICATE OF CORRECTION

PATENT NO. : 7,672,101 B2 Page 1 of 1
APPLICATION NO. : 11/852799
DATED : March 2, 2010
INVENTOR(S) : Shu-Huei Lin et al.

It is certified that error appears in the above-identified patent and that said Letters Patent is hereby corrected as shown below:

Title Page Item (57), Abstract, Line 2, after "driven" delete "devise" and insert -- device --.

Title Page Item (57), Abstract, Line 9, after "transistor" delete "sad" and insert -- and --.

Column 1, Line 57, after "second" delete "simply" and insert -- supply --.

Column 2, Line 12, after "NMOS" delete "poll down" and insert -- pull-down --.

Column 2, Line 15, after "resistance" delete "steed" and insert -- sized --.

Column 2, Line 24, after "of" delete "fee" and insert -- the --.

Column 2, Line 27, after "bipolar" detele "function" and insert -- junction --.

Column 2, Line 36, delete "OP" and insert -- OF --.

Column 2, Line 51, after "are to" delete "he" and insert -- be --.

Column 2, Line 63, delete "Second" and insert -- second --.

Column 3, Line 12, delete "258" and insert -- 256 --.

Column 3, Line 36, delete "dram" and insert -- drain --.

Column 3, Line 50, delete "dram" and insert -- drain --.

Column 4, Line 1, delete "254" and insert -- 264 --.

Column 4, Line 14, delete ";" and insert -- : --.

Column 6, Claim 10, Line 7, after "bipolar" delete "iunction" and insert -- junction --.

Signed and Sealed this

Twenty-seventh Day of April, 2010

David J. Kappos
*Director of the United States Patent and Trademark Office*